SERVO POWER AMPLIFIER
Filed July 1, 1960
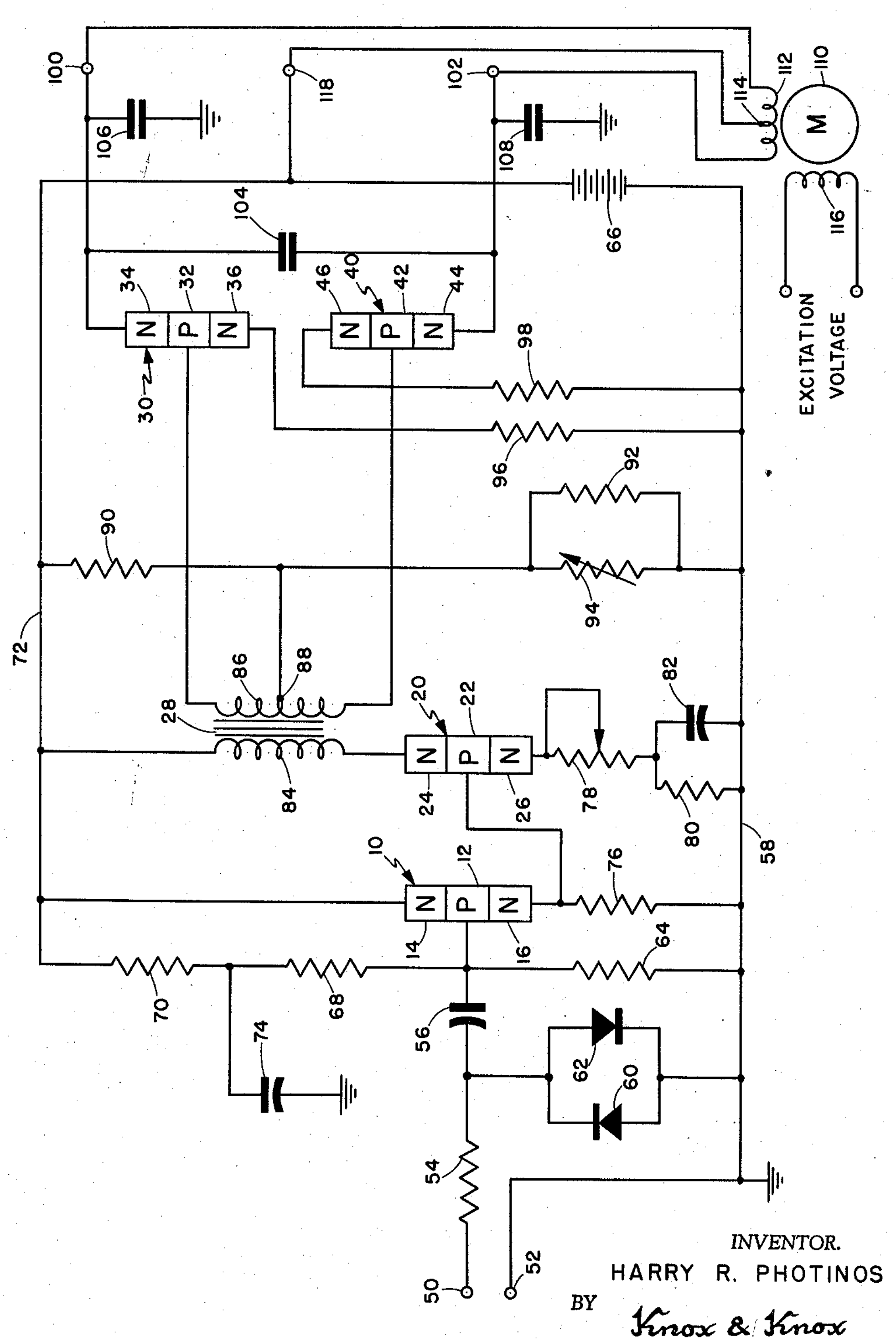
INVENTOR.
HARRY R. PHOTINOS
BY Knox & Knox

United States Patent Office 3,101,437

Patented Aug. 20, 1963

3,101,437

SERVO POWER AMPLIFIER

Harry R. Photinos, San Diego, Calif., assignor to The Ryan Aeronautical Co., San Diego, Calif.

Filed July 1, 1960, Ser. No. 40,299

1 Claim. (Cl. 318—207)

The present invention relates generally to amplifiers and more particularly to a servo power amplifier.

The primary object of this invention is to provide a servo power amplifier for driving a two phase servo motor, the amplifier being fully transistorized and having an inherent 90 degree phase shift which is required for such a motor.

Another object of this invention is to provide a servo power amplifier in which the 90 degree phase shift is obtained as a feature of the basic amplifier circuit without the use of a series capacitor type phase shifter which would require line frequency regulation for proper servo operation.

Another object of this invention is to provide a servo power amplifier in which the phase shift is 90 degrees to close approximation for normal line frequency variations and is independent of temperature and aging.

Still another object of this invention is to provide a servo power amplifier having an emitter follower input stage with high input impedance and a push pull output stage, coupled in such a manner that no output transformer is needed for coupling and impedance matching of the load.

A further object of this invention is to provide a servo power amplifier which contains a minimum of components and has a high degree of stability over a wide range of operating conditions.

Finally, it is an object to provide a servo power amplifier of the aforementioned character which is simple and convenient to build and install and which will give generally efficient and durable service.

With these and other objects definitely in view, this invention consists in the novel construction, combination and arrangement of elements and portions, as will be hereinafter fully described in the specification, particularly pointed out in the claims, and illustrated in the drawing which forms a material part of this disclosure, and in which the single figure is a schematic wiring diagram of the amplifier.

The amplifier includes basically an input stage utilizing an emitter follower input transistor 10 having a base 12, collector 14 and emitter 16, and a grounded emitter driver transistor 20 having a base 22, collector 24 and emitter 26, which is coupled through a driver transformer 28 to a pair of output transistors 30 and 40 connected in push pull. The output transistor 30 has a base 32, collector 34 and emitter 36 while transistor 40 has a base 42, collector 44 and emitter 46.

The amplifier has a source of A.C. input signal applied to input terminals 50 and 52, terminal 50 being connected through a dropping resistor 54 and coupling capacitor 56 to the base 12. The input terminal 52 leads to a grounded common conductor 58 and coupled across the input, from terminal 52 to the input end of resistor 54 are two clamping diodes 60 and 62 connected in parallel to conduct in opposite directions. The base 12 is connected through a voltage divider resistor 64 to the common conductor 58 which leads to the negative side of a D.C. power supply, indicated as a battery 66. The base 12 is also connected through a voltage divider resistor 68 and a filter resistor 70 to a further common conductor 72, which is connected to the positive side of battery 66. The junction of resistors 68 and 70 is coupled to ground through a filter capacitor 74, said capacitor and the resistor 70 acting to filter out ripple of the D.C. power supply and prevent any ripple from appearing in the input.

The emitter 16 is connected directly to the base 22 and also to the common conductor 58 through an emitter load resistor 76, which optimizes operating current of the input transistor 10, the collector 14 being connected to common conductor 72. The emitter 26 is connected to common conductor 58 through a gain adjustment potentiometer 78 and also through an emitter bias resistor 80 and emitter bypass capacitor 82 in parallel. For specific gain requirements the potentiometer 78 can be replaced by a fixed resistor if desired. Collector 24 is coupled to one end of the input winding 84 of driver transformer 28, the other end of said winding being connected to common conductor 72. The ends of the output winding 86 of output transformer 28 are connected to the bases 32 and 42 of output transistors 30 and 40, respectively, said output winding having a center tap 88 which is coupled to common conductor 72 through a voltage dropping resistor 90 to control output stage bias. The center tap 88 is also connected through a voltage divider resistor 92 to common conductor 58, said resistor acting as a shunt in the output stage bias network, and coupled in parallel with resistor 92 is a negative temperature compensation resistor 94.

The emitters 36 and 46 are connected to common conductor 58 through bias stabilization resistors 96 and 98 and collectors 34 and 44 are connected to output terminals 100 and 102, respectively. Coupled across terminals 100 and 102 is a tuning capacitor 104 to optimize amplifier load condition, the value of said capacitor being dependent on motor load and frequency. In instances where coupling exists between output and input signals, the output terminals 100 and 102 must be grounded through capacitors 106 and 108, respectively.

Miniature servo motors, for use with which the present amplifier is intended, are of the two phase variety requiring a 90 degree phase shift between the winding excitation voltages, this type of motor eliminating the need for an output transformer. The servo motor 110 has an input winding 112 with a center tap 114 and an excitation winding 116 connected to a suitable source of excitation voltage. Output terminals 100 and 102 are connected to opposite ends of the input winding 112, the center tap 114 being connected to a center output terminal 118 which is coupled to the positive side of battery 66. Phase angle accuracy is very important in small servo motors, since torque is proportional to the cosine of angular error, or difference from the desired phase angle, at the motor windings, the error being accumulated from all sources. In the circuit illustrated, the phase shift network comprises a constant current collector driving source, which is the driver transistor 20, coupled to the primary or input winding 84 of driver transformer 28, this providing a 90 degree leading phase shift. The particular method of coupling the driver transistor to its driver transformer avoids the need for a tuning network for resonance tuning of the load and provides the inherent 90 degree phase shift necessary for operation of a two phase servo motor. The driver stage is direct coupled to the input stage and drives a class B biased, push-pull output stage.

In the input stage, the forward conduction characteristics of the clamping diodes 60 and 62 protect the input transistor 10 from amplitude overloading and limit input voltage to the required degree, without imposing a penalty in gain or input impedance for operation below the critical level. The direct coupling of driver transistor 20 to input transistor 10 provides good current regulation for both stages, the transistor current regulation factor being very high, even when using transistors of low beta value. Addition of a negative temperature compensation resistor 94 to the voltage dividing resistors 90 and 92 ensures maximum gain control, consistent with transistor current regulation, over a wide temperature range. Bias stabilization resistors 96 and 98 control emitter degeneration and ensure against thermal runaway of output transistors having high collector to base leakage current. While various types of transistors may be used in the output stage, silicon power transistors are desirable for their stable current gain characteristics and ease of temperature compensation.

Due to the absence of separate motor phase shift and driver transformer tuning networks, the amplifier does not require negative loop feedback for amplifier phase stabilization. The extreme simplicity of the circuit is a great advantage in the miniaturized equipment used in airborne electronic apparatus, the inherent reliability and minimum need for adjustment or servicing being very desirable.

The operation of this invention will be clearly comprehended from a consideration of the foregoing description of the mechanical details thereof, taken in connection with the drawing and the above recited objects. It will be obvious that all said objects are amply achieved by this invention.

It is understood that minor variation from the form of the invention disclosed herein may be made without departure from the spirit and scope of the invention, and that the specification and drawings are to be considered as merely illustrative rather than limiting.

I claim:

A non-feedback servo power amplifier, comprising:

a transistor connected in a constant-current common-emitter configuration, whereby said transistor has a relatively high effective resistance;

means for applying an input signal to said transistor;

a transformer having a low inductance primary winding and a secondary winding;

means for applying the output from said transistor to said primary winding, whereby the signals across said transistor and said primary have a stable substantially 90 degree phase difference as the ratio of said resistance to the inductive reactance increases, said stability being inherent and not requiring negative feedback;

a push-pull amplifier;

means for causing said secondary to drive said push-pull amplifier;

a servo motor having a first winding and a center-tapped second winding;

means for applying a first driving signal to said first winding of said motor, said first driving signal being in phase with said input signal;

means for applying a second driving signal to said second winding of said motor, said second driving signal being obtained from said push-pull amplifier, whereby the second driving signal is substantially 90 degrees out of phase with said first driving signal, and may cause said motor to rotate in either direction in accordance with said input signal.

References Cited in the file of this patent

UNITED STATES PATENTS

| | | |
|---|---|---|
| 2,844,667 | Yaeger | July 22, 1958 |
| 2,951,991 | Rickner et al. | Sept. 6, 1960 |

OTHER REFERENCES

Darr: "Transistor and Hybrid Auto Radios," Radio-Electronics, December 1957, pages 42 and 43.